(12) United States Patent
Yu

(10) Patent No.: US 6,642,122 B1
(45) Date of Patent: Nov. 4, 2003

(54) DUAL LASER ANNEAL FOR GRADED HALO PROFILE

(75) Inventor: Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/254,850

(22) Filed: Sep. 26, 2002

(51) Int. Cl.⁷ .................. H01L 21/336; H01L 21/331; H01L 21/8238; H01L 21/04; H01L 21/38
(52) U.S. Cl. .................. 438/372; 438/300; 438/231; 438/510; 438/549; 438/662
(58) Field of Search .................. 438/300, 301, 438/302, 305, 306, 308, 662, 231, 232, 369, 371, 372, 373, 375, 376, 378, 510, 519, 527, 535, 543, 549

(56) References Cited

U.S. PATENT DOCUMENTS

| | | | | |
|---|---|---|---|---|
| 6,153,455 A | * | 11/2000 | Ling et al. | 438/231 |
| 6,238,960 B1 | * | 5/2001 | Maszara et al. | 438/197 |
| 6,251,761 B1 | * | 6/2001 | Rodder et al. | 438/591 |
| 6,287,924 B1 | * | 9/2001 | Chao et al. | 438/300 |
| 6,361,874 B1 | * | 3/2002 | Yu | 428/514 |
| 6,365,476 B1 | * | 4/2002 | Talwar et al. | 438/308 |
| 6,368,947 B1 | * | 4/2002 | Yu | 438/530 |
| 6,380,044 B1 | * | 4/2002 | Talwar et al. | 438/308 |
| 6,420,264 B1 | * | 7/2002 | Talwar et al. | 438/682 |
| 6,472,277 B1 | * | 10/2002 | Cheong et al. | 438/289 |
| 6,551,888 B1 | * | 4/2003 | Tabery et al. | 438/308 |
| 6,555,439 B1 | * | 4/2003 | Xiang et al. | 438/305 |
| 6,559,015 B1 | * | 5/2003 | Yu | 438/301 |

* cited by examiner

Primary Examiner—Caridad Everhart
Assistant Examiner—Chuong A Luu

(57) ABSTRACT

Short-channel effects are controlled by forming abrupt, graded halo profiles. Embodiments include sequentially forming deep source/drain regions, ion implanting to form first deep amorphized regions, ion implanting an impurity into the first deep amorphized regions to form first deep halo implants, laser thermal annealing to recrystallize the first deep amorphized regions and activate the deep halo regions, ion implanting to form second shallow amorphized regions within the deep halo regions, ion implanting an impurity into the second shallow amorphous regions to form second shallow halo implants and laser thermal annealing to recrystallize the second shallow amorphous regions and to activate the shallow halo regions. Embodiments further include forming shallow source/drain extensions within the shallow halo implants and laser thermal annealing to activate the shallow source/drain extensions.

15 Claims, 11 Drawing Sheets

DUAL LASER ANNEAL FOR GRADED HALO PROFILE

FIELD OF THE INVENTION

The present invention relates to a method of manufacturing semiconductor devices with sub-micron dimensions. The present invention has particular applicability in manufacturing high density semiconductor devices with transistors having reduced short-channel effects.

BACKGROUND ART

The increasing demand for micro-miniaturization requires scaling down various horizontal and vertical dimensions in various device structures. As the thickness of the ion implanted source/drain junctions of transistors is scaled down, there is a corresponding scaled increase in the substrate channel doping in order to maintain a constant electric field in the transistor channel for higher speed performance. These objectives are achieved, in part, by not only forming shallow junctions but also forming source/drain extensions with an abrupt junction/dopant profile slope in proximity to the transistor channel in order to reduce penetration of the source/drain dopant into the transistor channel which occurs as the junction/profile slope becomes less abrupt. Such short channel effects result in poor threshold voltage roll-off characteristics for sub-micron devices.

There exists a continuing need for methodology enabling the fabrication of semiconductor devices containing transistors with source/drain extension junction/profiles which are shallow, abrupt and have a high surface concentration.

DISCLOSURE OF THE INVENTION

An advantage of the present invention is a method of manufacturing a semiconductor device having reduced short-channel effects.

Another advantage of the present invention is a method of manufacturing a semiconductor device having scaled MOSFETs with very abrupt and graded halo profiles for reduced short-channel effects.

Additional advantages and other features of the present invention will be set forth in the description which follows and, in part, will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method manufacturing a semiconductor device, the method comprising: forming a gate electrode over an upper surface of a substrate with a gate insulating layer therebetween; forming deep source/drain regions in the substrate on opposite sides of the gate electrode; ion implanting to form deep amorphized regions on each side of the gate electrode extending into the substrate to a first depth; ion implanting an impurity into the deep amorphized regions to form deep halo implants; laser thermal annealing to recrystallize the deep amorphized regions and to activate the deep halo implants to form deep halo regions; ion implanting to form shallow amorphized regions extending into the substrate to a second depth, less than the first depth, within the deep halo regions; ion implanting an impurity into the shallow amorphized regions to form shallow halo implants; and laser thermal annealing to recrystallize the shallow amorphized regions and to activate the shallow halo implants to form shallow halo regions.

Embodiments of the present invention comprise ion implanting to form third amorphized regions within the shallow halo regions, ion implanting an impurity into the substrate to form shallow source/drain implants within the third amorphized regions, and laser thermal annealing to activate the shallow source/drain implants to form shallow source/drain extensions extending into the substrate to a third depth less than the second depth. Embodiments of the present invention further include forming an oxide liner on side surfaces of the gate electrode extending on a portion of the surface of the substrate on each side of the gate electrode, forming sidewall spacers, comprising silicon nitride, on the oxide liner, ion implanting to form the deep source/drain implants, annealing to form the deep source/drain regions, removing the sidewall spacers and oxide liner, and ion implanting to form the deep amorphized regions. Embodiments of the present invention further include forming the deep source/drain regions and shallow source/drain extensions with impurities of a first conductivity type and forming the deep and shallow halo regions with impurities of a second conductivity type, opposite the first conductivity type. Embodiments of the present invention also comprise forming the deep halo regions at a first impurity concentration and forming the shallow halo regions with a second impurity concentration greater than the first impurity concentration.

Additional advantages of the present invention will be readily apparent to those skilled in the art from the following detailed description wherein the embodiments of the present invention are described simply by way of illustration of the best mode contemplated for carry out the present invention. As will be realized, the present invention is capable of other and different embodiments, and its several details are capable of modifications in various obvious respects, all without departing from the present invention. Accordingly, the drawings and description are to be regarded as illustrative in nature, not as restrictive.

BRIEF DESCRIPTION OF THE DRAWINGS

In FIGS. 1 through 11, similar features are denoted by similar reference characters.

DESCRIPTION OF THE INVENTION

Figure 1:
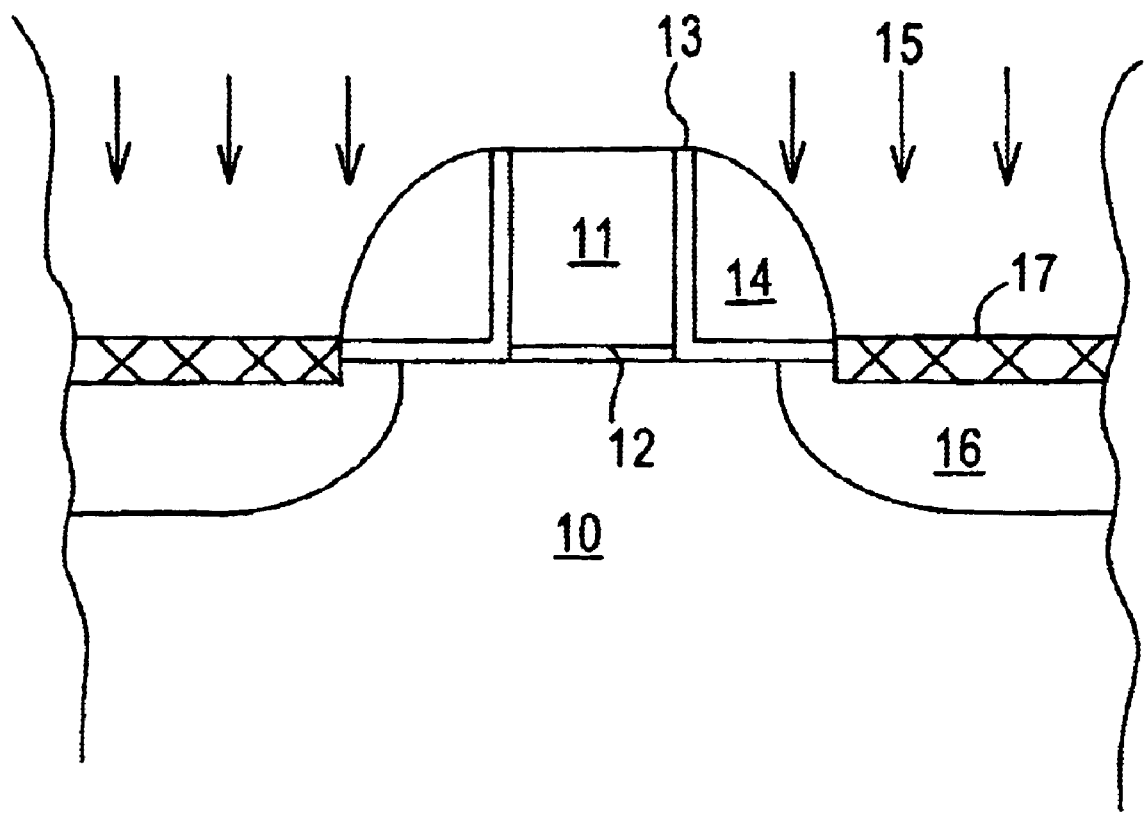
FIGS. 1 through 11 schematically illustrate sequential phases of a method in accordance with an embodiment of the present invention.

The present invention addresses and provides a solution to the problem of forming micro miniaturized semiconductor devices having scaled down MOSFETs with significantly reduced short channel effects. This objective is achieved, in part, by forming very abrupt and graded halo profiles employing a dual laser thermal annealing technique. Embodiments of the present invention comprise forming abrupt and graded halo profiles by sequentially performing a pre-amorphization implant, halo implant and laser thermal annealing. By advantageously employing laser thermal annealing, very locally and sharply defined halo regions can be formed in an extremely short period of time without causing diffusion to such an extent that the halo region is lost, as in conventional practices. Thus, the present invention enables the accurate definition of two halo regions without inter-diffusion therebetween.

An embodiment of the present invention is schematically illustrated in FIGS. 1 through 11. Adverting to FIG. 1, a gate electrode 11 is formed over a substrate 10, e.g., doped monocrystalline silicon, with a gate insulating layer 12 therebetween, e.g., silicon oxide. The gate electrode 11 typically has a width of about 100 Å to 1,000 Å, and the gate oxide layer 12 typically has a thickness of 30 Å to 200 Å. An oxide liner 13, such as silicon oxide, is formed on side surfaces of gate electrode 11 and extends on a portion of the upper surface of substrate 10 on each side of gate electrode 11. Silicon oxide liner 13 typically has a thickness of 200 Å to 600 Å. A metal silicide layer 17, is formed on the upper surface of substrate 10. Ion implantation is conducted, as illustrated by arrows 15, to form deep source/drain implants followed by rapid thermal annealing to form deep source/drain regions 16. Ion implantation 15 can be conducted before or after forming metal silicide layer 17. Metal silicide layers are typically formed at a thickness of about 50 Å to 200 Å and typically comprise nickel silicide, cobalt silicide or titanium silicide. Ion implantation 15 to form deep source/drain implants is typically conducted at an implantation dosage to about $1 \times 10^{15}$ to about $1 \times 10^{16}$ ions/cm$^2$ at a typical implantation energy of 5 to 30 KeV. Rapid thermal annealing to activate source/drain regions 16 is typically conducted at a temperature of about 900° C. to about 1,050° C. for 5 seconds to 60 minutes.

Figure 2:
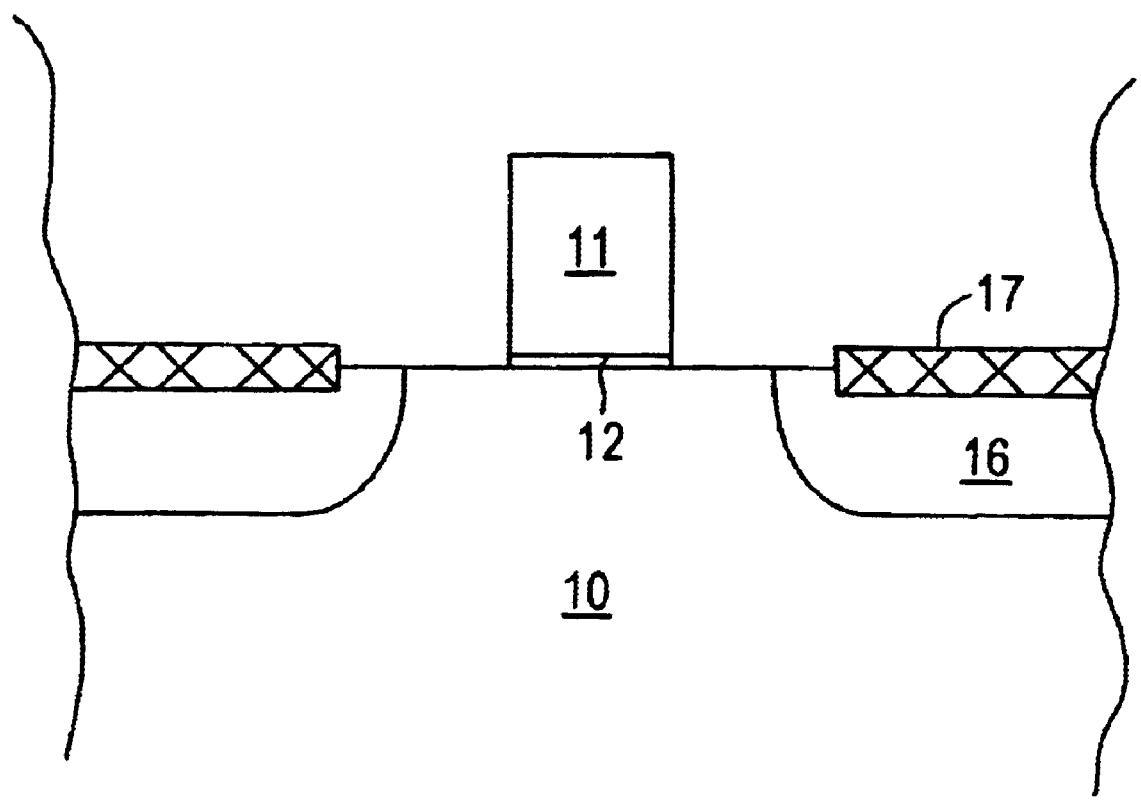

Adverting to FIG. 2, silicon nitride sidewall spacers 14 and silicon oxide liner 13 are then removed. Silicon nitride spacers 14 can be removed employing a conventional etching technique as with a boiling phosphoric acid solution. Silicon oxide liner 13 can be removed employing a conventional etching technique as with a buffered hydrofluoric acid. The resulting intermediate structure is depicted in FIG. 2. At this point in the inventive method, the halo regions are defined.

Figure 3:
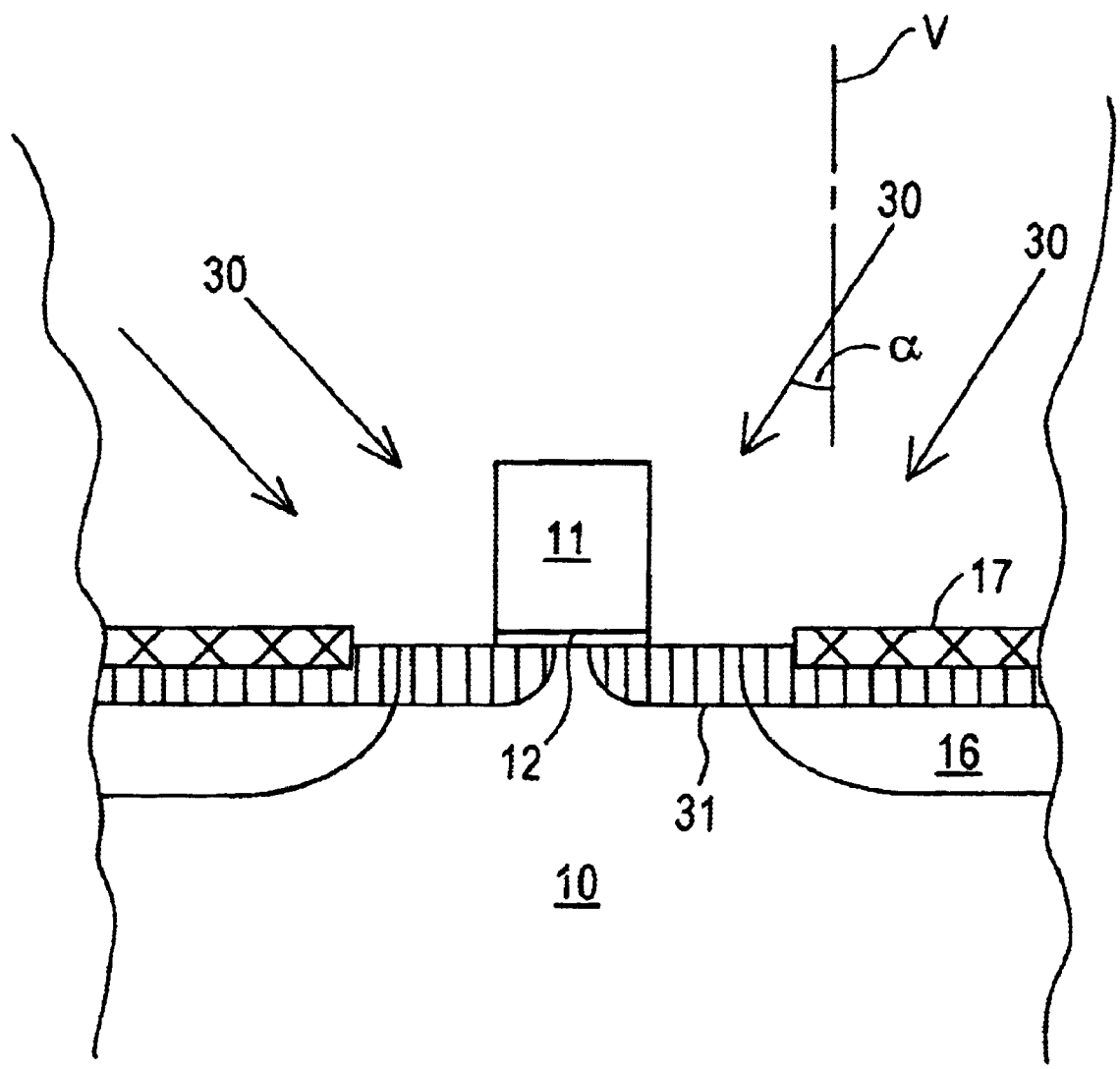
Figure 4:
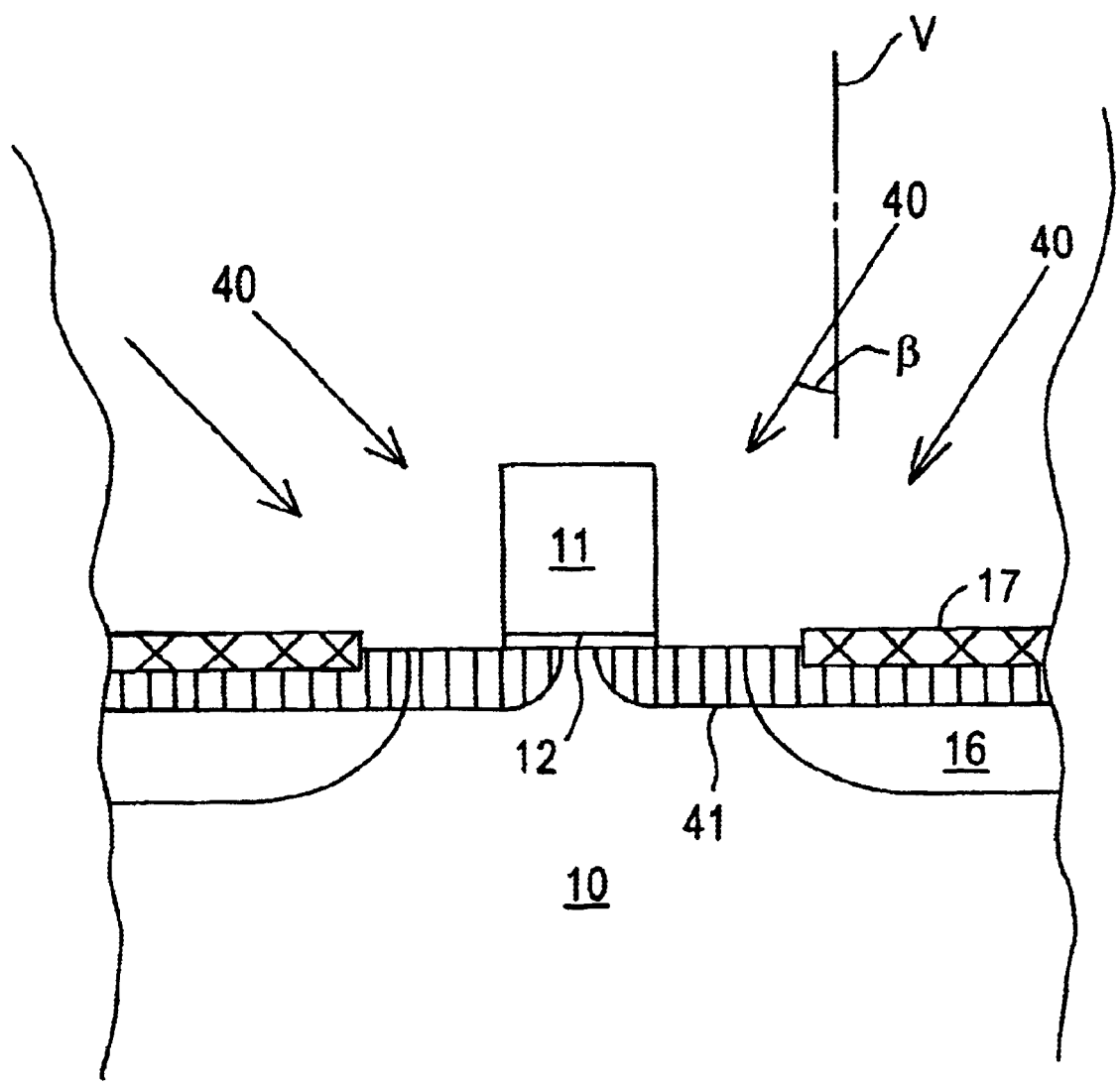

Adverting to FIG. 3, ion implantation is conducted, as illustrated by arrows 30, to pre-amorphize the intended deep halo region 31. Ion implantation 30 is typically conducted at an angle α from a line V perpendicular to the upper surface of the substrate, wherein α can range from 0° to 45°. Such an initial pre-amorphization implant, to form deep amorphized regions 31 extending from under gate electrode 11 toward deep source/drain regions 16, can be implemented by ion implanting silicon (Si), germanium (Ge) or xenon (Xe). For example, Xe can be implanted at an implantation dosage of $1 \times 10^{14}$ to $5 \times 10^{14}$ ions/cm$^2$ at an implantation energy of 20 to 70 KeV to form deep amorphized regions 31 extending to a first depth, e.g., 200 Å to 400 Å, from the upper surface of the semiconductor substrate. Deep amorphized regions 31 typically have an impurity concentration peak at a depth of 100 Å to 200 Å from the upper surface of the substrate. Subsequently, ion implantation, as illustrated by arrows 40, is conducted at an angle β from a line V perpendicular to the upper surface of the substrate, which is similar to angle α, to inject impurities into the deep amorphized regions 31 to form deep halo implants 41. Typically, the impurity implanted to form the halo regions is of a conductivity type opposite to that employed to form the source/drain region 16. Deep halo ion implantation is typically implemented by ion implanting at an implantation dosage of $1 \times 10^{13}$ to $1 \times 10^{14}$ ions/cm$^2$ at an implantation energy of 5 to 30 KeV, wherein the deep halo implants 41 typically have an impurity concentration peak at a distance of 300 Å to 600 Å from the upper surface of substrate 10.

Figure 5:
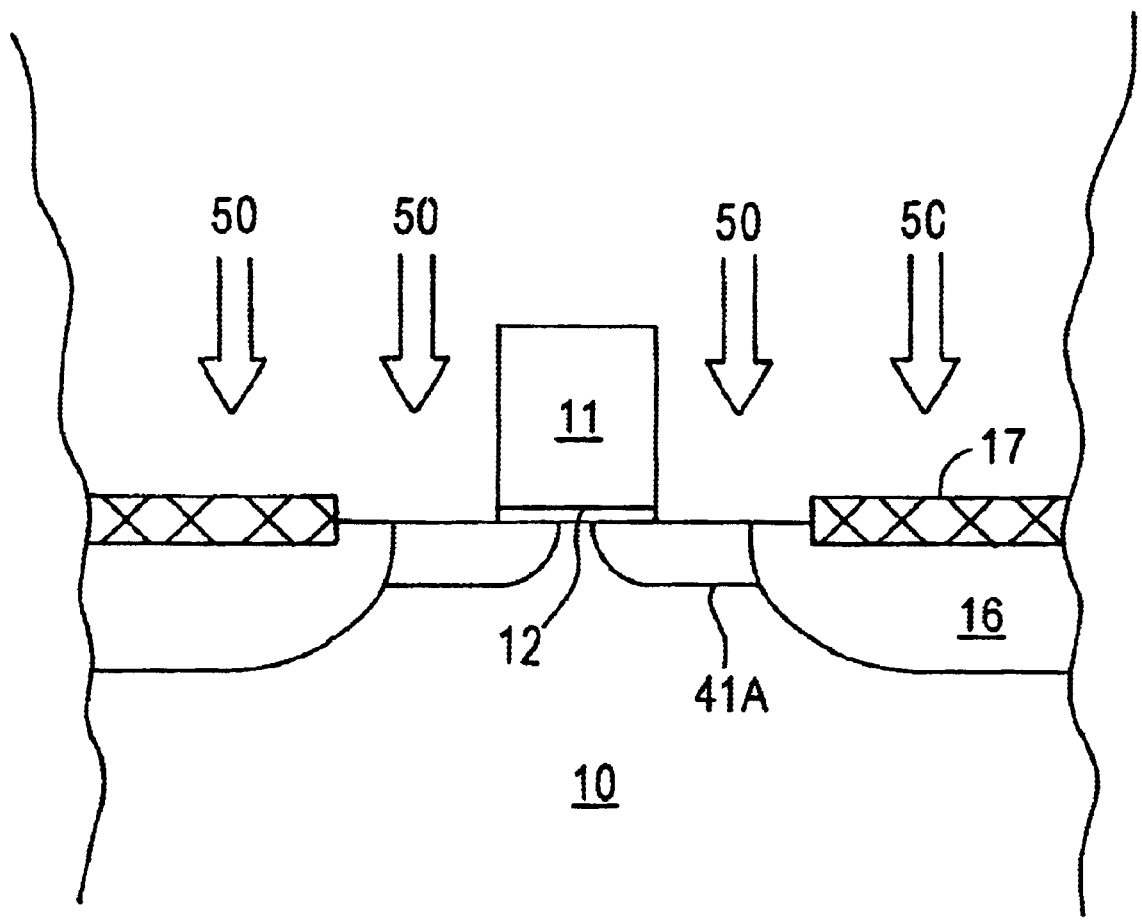

Subsequently, as illustrated by arrows 50 in FIG. 5, laser thermal annealing is conducted to recrystallize the deep pre-amorphized regions 31 and to activate the deep halo implant 41 to form deep halo regions 41 A extending to a depth of 200 Å to 400 Å from the upper surface of the substrate. Laser thermal annealing is typically implemented by impinging a laser light beam at a radiant fluence of 0.02 to 0.8 joules/cm$^2$ for 1 to 10 nanoseconds to rapidly elevate the substrate to a temperature of 1,200° C. to 1,300° C., followed by rapid quenching.

Figure 6:
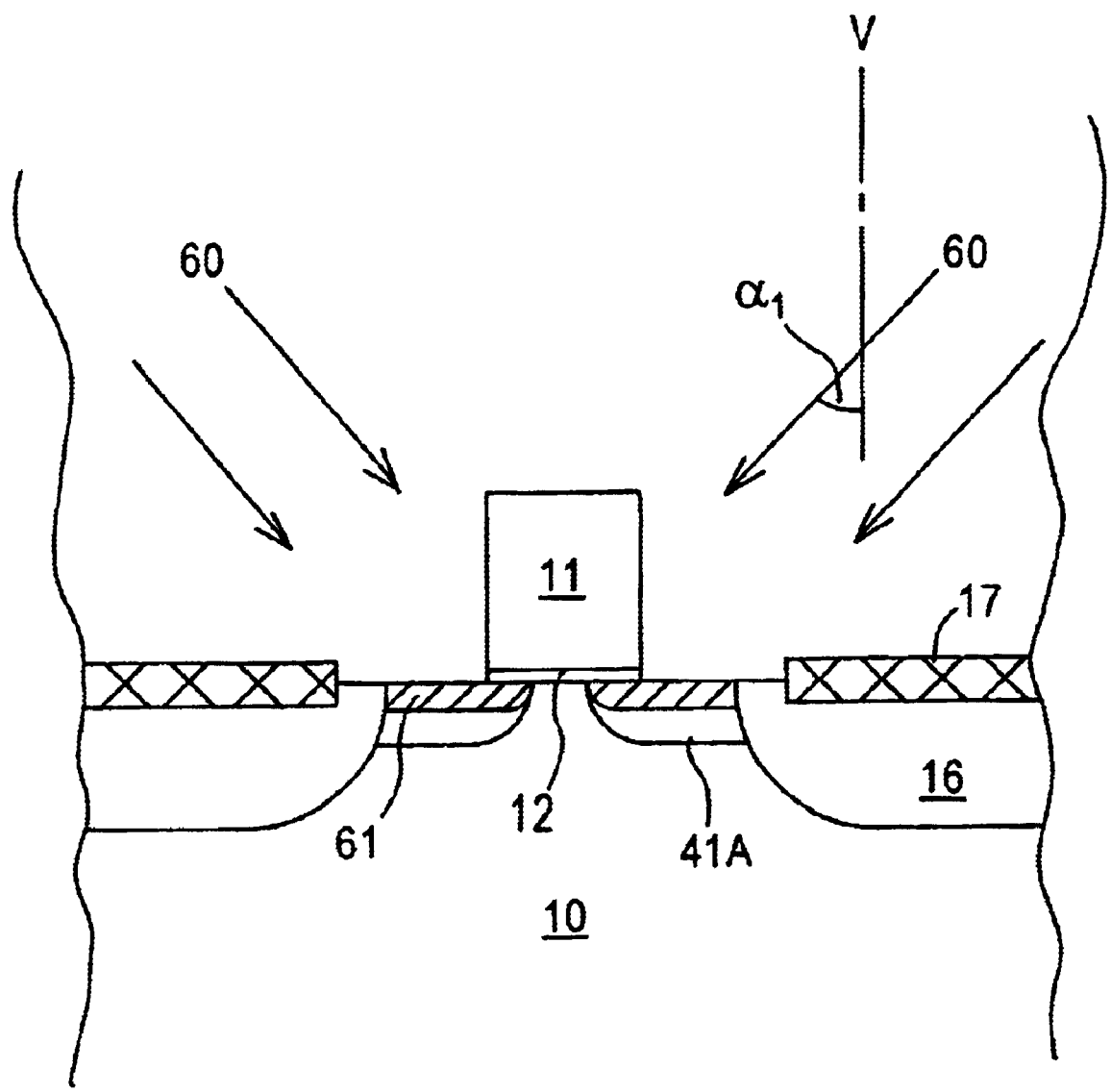
Figure 7:
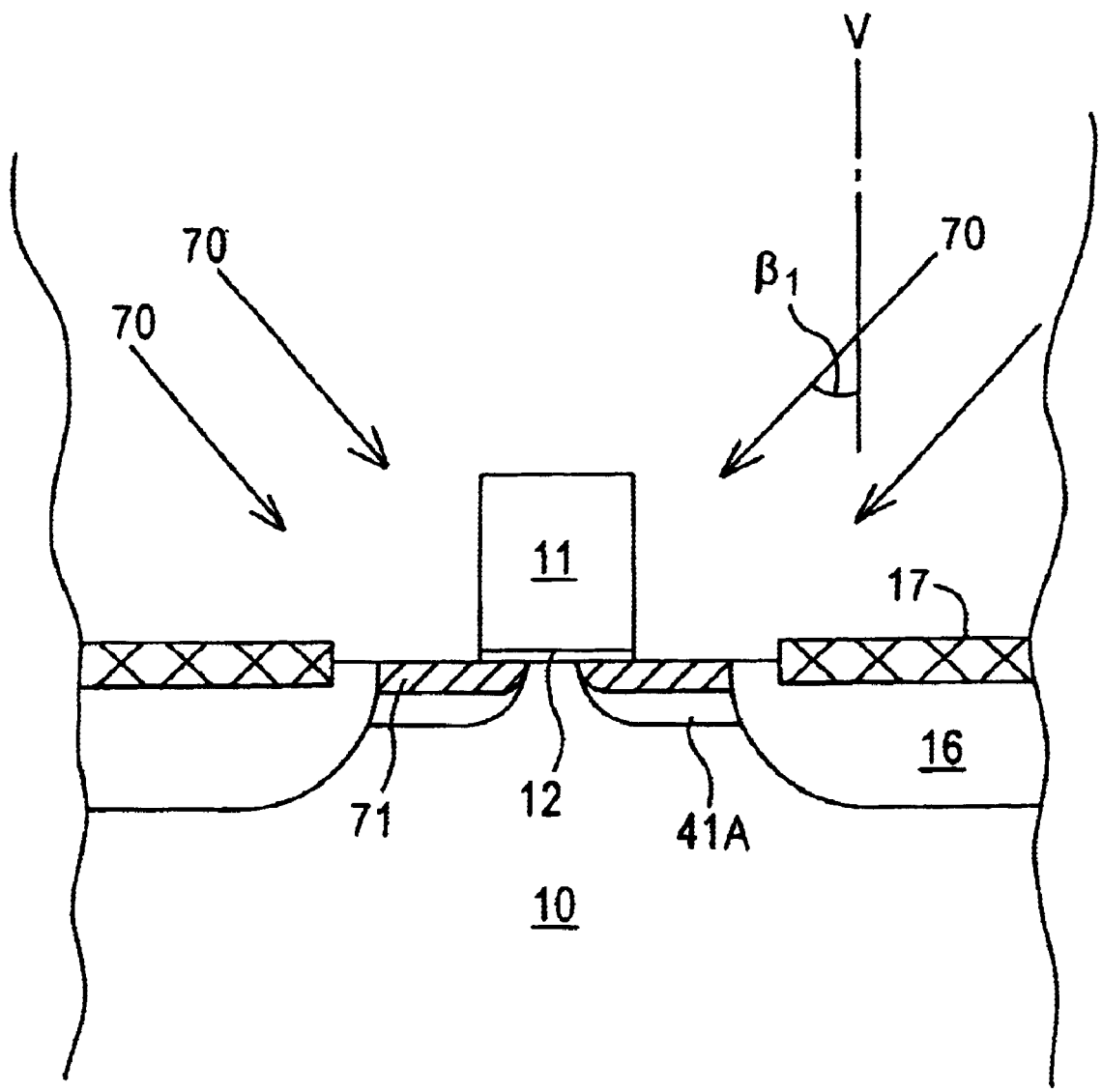
Figure 8:
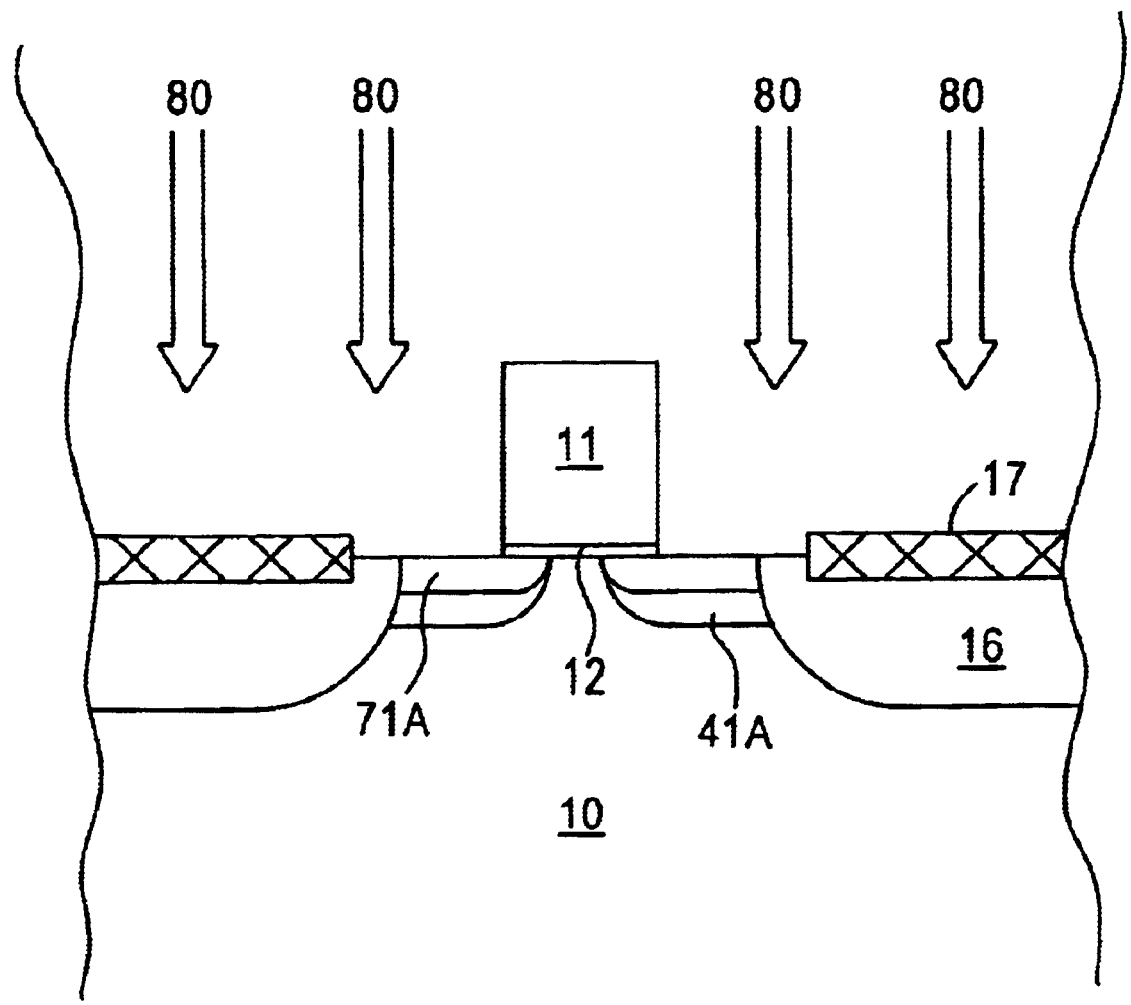

As illustrated in FIG. 6, ion implantation is again conducted to form shallow pre-amorphized regions 61, within deep halo regions 41A, as illustrated arrows 60 at an angle α, with respect to a line V perpendicular to the upper surface of the substrate, e.g. at angle of 0° to 60°. Shallow pre-amorphized regions 61 can be formed by ion implanting Xe at an implantation dosage of $1 \times 10^{14}$ to $5 \times 10^{14}$ ions/cm$^2$ an implantation energy of 10 to 40 KeV. Adverting to FIG. 7, a second ion implantation 70 is conducted to ion implant impurities within the shallow pre-amorphized region 61 to form shallow halo implant regions 71. Ion implantation 70 can be implemented by implanting B+ at an implantation dosage of $1 \times 10^{13}$ to $5 \times 10^{13}$ ions/cm$^2$ at an implantation energy of 5 to 10 KeV. The resulting halo implant 71 exhibits an impurity concentration peak at a depth of 150 Å to 300 Å in the upper surface substrate 10. Laser thermal annealing is then conducted, as illustrated by arrows 80 in FIG. 8, to recrystallize the shallow pre-amorphized regions 61 and to activate the shallow halo implants 41 to form shallow halo regions 71A. Laser thermal annealing 80 is typically conducted at a radiant fluence of 0.2 to 0.8 joules/cm$^2$ for 1 to 10 nanoseconds, thereby rapidly elevating the substrate temperature to 1,200° C. to 1,300° C. followed by rapid quenching. Shallow halo regions 71 typically extend to a depth of 150 Å to 400 Å from the upper substrate surface and typically have an impurity concentration greater than the impurity concentration of deep halo regions 41A. For example, the impurity concentration within halo regions 71A is about twice the impurity concentration within deep halo region 41A.

Figure 9:
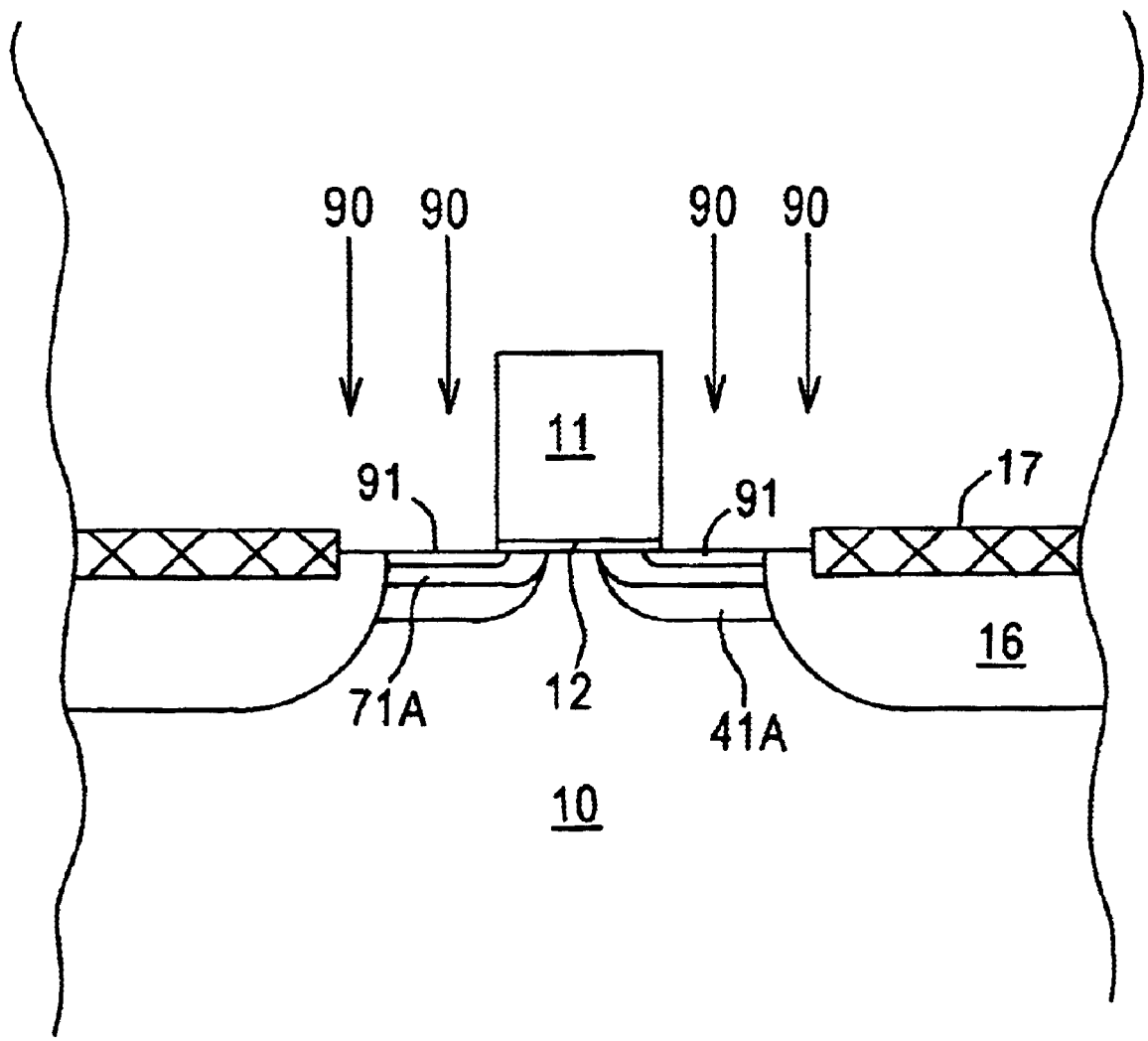
Figure 10:
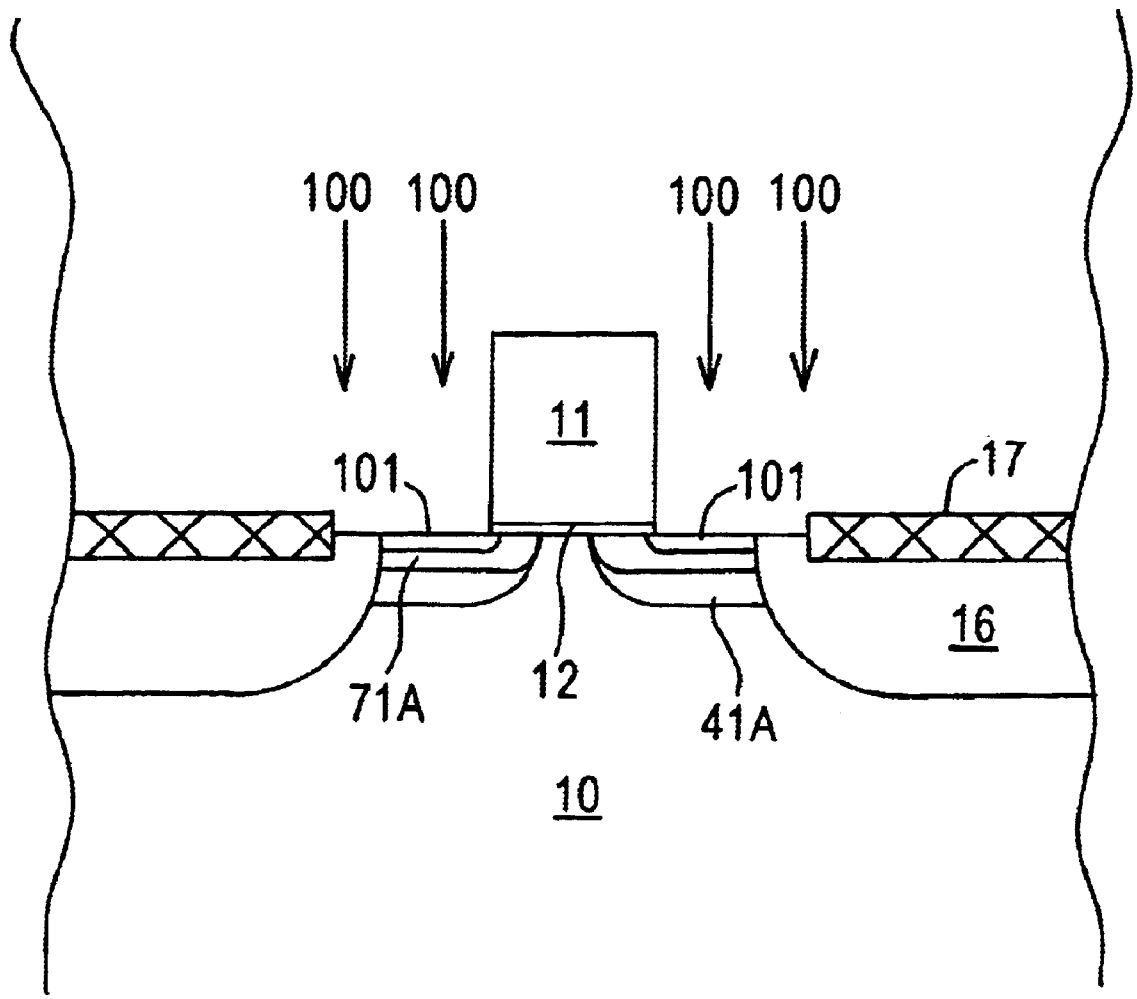
Figure 11:
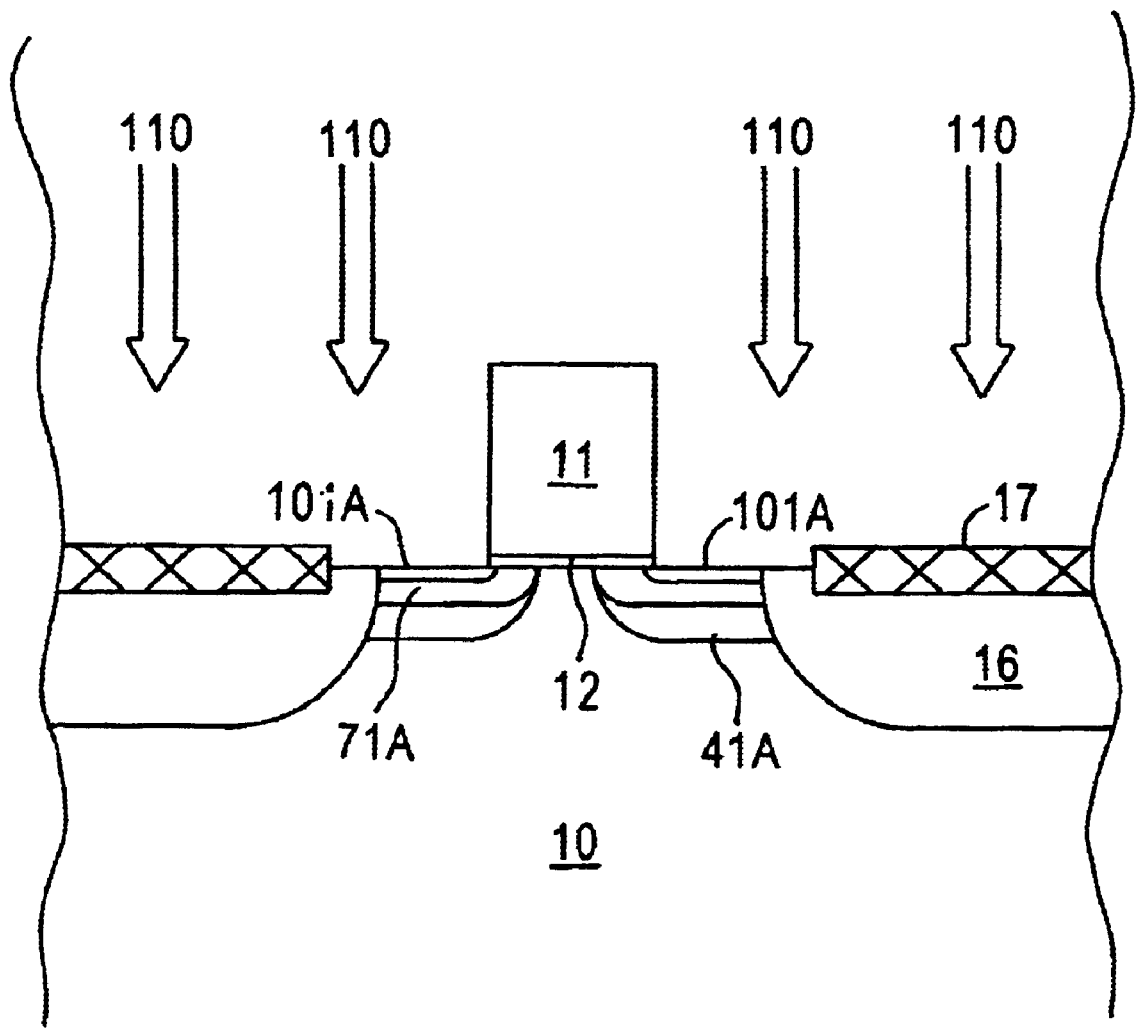

Subsequently, as illustrated in FIG. 9, ion implantation is conducted, as illustrated by arrows 90, to form third pre-amorphized regions 91, within the shallow halo regions 71, to define the subsequent shallow source/drain extensions. Ion implantation 90 to form pre-amorphized regions 91 can be implemented by implanting Xe at an implantation dosage of $1 \times 10^{14}$ to $5 \times 10^{14}$ ions/cm$^2$ at an implantation energy of 10 to 40 KeV. Ion implantation is then conducted to form source/drain implants 101, as illustrated by arrows 100 in FIG. 10. Ion implantation 100 may be implemented by implanting As+ at an implantation dosage of $1 \times 10^{14}$ to $5 \times 10^{14}$ ions/cm$^2$ and an implantation energy of 1 to 5 KeV. Subsequently, laser thermal annealing is conducted, as illustrated by arrows 110 in FIG. 11 to recrystallize the third pre-amorphized regions 91 and activate the shallow source/drain implants 101 to form shallow source/drain extensions 101A. Laser thermal annealing 110 may be implemented by impinging a pulsed laser light beam at a radiant fluence of 0.2 to 0.8 joules/cm$^2$ for 1 to 10 nanoseconds, thereby rapidly elevating temperature of the upper surface of the substrate to 1,200° C. to 1,300° C., followed by rapid quenching.

The strategic use of laser thermal annealing enables the formation of precisely defined localized halo regions without inter-diffusion, thereby enabling the formation of sharply defined, abrupt and graded halo profiles. The use of a laser light beam enables an extremely rapid heating and cooling cycle, thereby controlling the thermal budget and enabling the formation of abrupt, locally contained halo regions without diffusion therebetween, and with high reproducibility. Further, the use of a laser light beam enables pin-point accuracy in targeting a specific area of the substrate, thereby avoiding unnecessarily elevating the temperature of other portions of the wafer causing various problems, such as defects and diffusion issues.

In implementing embodiments of the present invention, any of various commercially available laser tools may be employed, such as those utilizing a laser source capable of operating at energies of about 10 to about 2,0000 m/cm$^2$/pulse, e.g., about 100 to 400 m/cm$^2$/pulse. Commercially available tools exist which can perform such laser annealing, either with or without mask. The Verdant Technologies laser anneal tool is but an example and operates at an exposure wavelength of 308 nm.

The present invention enables the manufacture of microminiaturized semiconductor devices with scaled down MOSFETs having sharply defined, abrupt graded halo regions, thereby significantly reducing short channel effects. The present invention enjoys industrial applicability in fabricating various types of highly miniaturized semiconductor devices with improved reliability, performance speed and reproducibility. The present invention has particular applicability in fabricating semiconductor devices with design features in the deep sub-micron regime, as with a design rule less than about 0.12 micron, with significantly improved reliability and high performance speed.

In the preceding detailed description, the present invention is described with reference to specific exemplary embodiments thereof. It will, however, be evident that various modifications and changes may be made thereto, without departing from the broader scope of the present invention, as set forth in the claims. The specification and drawings are, accordingly, to be regarded as illustrative and not as restrictive. It is understood that the present invention is capable of using various other combinations and environments and is capable of changes or modifications within the scope of the inventive concept as expressed herein.

What is claimed is:

1. A method of manufacturing a semiconductor device, the method comprising:
   forming a gate electrode over an upper surface of a substrate with a gate insulating layer therebetween;
   forming deep source/drain regions in the substrate on opposite sides of the gate electrode;
   ion implanting to form deep amorphized regions on each side of the gate electrode extending into the substrate to a first depth;
   ion implanting an impurity into the deep amorphized regions to form deep halo implants;
   laser thermal annealing to recrystallize the first deep amorphized regions and to activate the deep halo implants to form deep halo regions;
   ion implanting to form shallow amorphized regions extending into the substrate to a second depth, less than the first depth, within the deep halo regions;
   ion implanting an impurity into the shallow amorphized regions to form shallow halo implants; and
   laser thermal annealing to recrystallize the shallow amorphized regions and to activate the shallow halo implants to form shallow halo regions.

2. The method according to claim 1, further comprising:
   ion implanting an impurity into the substrate to form shallow source/drain implants within the shallow halo regions; and
   laser thermal annealing to activate the shallow source/drain implants to form shallow source/drain extensions extending into the substrate to a third depth less than the second depth.

3. The method according to claim 2, comprising forming metal silicide layers on the upper surface of the substrate over the deep source/drain regions before ion implanting to form the deep amorphized regions.

4. The method according to claim 3, comprising:
   forming a sidewall spacer on side surfaces of the gate electrode;
   ion implanting to forming deep source/drain implants;
   annealing to form the deep source/drain regions;
   removing the side wall spacers; and
   ion implanting to form the deep amorphized regions.

5. The method according to claim 4, comprising:
   forming an oxide liner on side surfaces of the gate electrode extending on a portion of the upper surface of the substrate on each side of the gate electrode; and
   forming the side wall spacers, comprising silicon nitride, on the oxide liner.

6. The method according to claim 4, comprising ion implanting at an angle of 0° to 45° with respect to a line perpendicular to the upper surface of the substrate, to form the deep amorphized regions.

7. The method according to claim 6, comprising ion implanting at an angle of 0° to 45° with respect to a line perpendicular to the upper surface of the substrate to form the deep halo implants.

8. The method according to claim 4, comprising ion implanting at an angle of 0 to 60° with respect to a line perpendicular to the upper surface of the substrate to form the shallow amorphized regions.

9. The method according to claim 8, comprising ion implanting at an angle of 0 to 60° with respect to a line perpendicular to the upper surface of the substrate to form the shallow halo implants.

10. The method according to claim 4, comprising laser thermal annealing at a radiant fluence of 0.2 to 0.8 joules/cm$^2$ for about 1 to about 10 nanoseconds to recrystallize the deep amorphized regions and form the deep halo regions.

11. The method according to claim 4, comprising laser thermal annealing at a radiant fluence of 0.2 to 0.8 joules/cm$^2$ for 1 to 10 nanoseconds to recrystallize the shallow amorphized regions and form the shallow halo regions.

12. The method according to claim 4, comprising laser thermal annealing at a radiant fluence of 0.2 to 0.8 joules/cm$^2$ for 1 to 10 nanoseconds to activate the shallow source/drain extensions.

13. The method according to claim 4, comprising:
   ion implanting an impurity of a first conductivity type to form the deep source/drain regions and shallow source/drain extensions; and
   ion implanting an impurity of a second conductivity type, opposite the first conductivity type, to form the deep and shallow halo regions.

14. The method according to claim 4, comprising:
   forming the deep halo regions with a first impurity concentration; and
   forming the shallow halo regions with a second impurity concentration greater than the first impurity concentration.

15. The method according to claim 4, comprising:
   ion implanting to form shallow amorphized regions within the shallow halo regions;
   ion implanting the impurity into the substrate to form the shallow source/drain implants within the shallow amorphized regions formed within the shallow halo regions; and
   laser thermal annealing to recrystallize the third shallow amorphized regions and to activate the shallow source/drain implants to form the source/drain extenstions.

* * * * *